United States Patent [19]

Sindlinger et al.

[11] 4,152,751

[45] May 1, 1979

[54] PHOTOFLASH UNIT WITH SECURED INSULATOR

[75] Inventors: Ronald E. Sindlinger, Muncy, Pa.; Emery G. Audesse, Beverly, Mass.; Donald H. Pfefferle, Williamsport, Pa.

[73] Assignee: GTE Sylvania Incorporated, Stamford, Conn.

[21] Appl. No.: 861,652

[22] Filed: Dec. 19, 1977

[51] Int. Cl.² ............................................. G03B 15/02
[52] U.S. Cl. ..................................... 362/13; 362/237; 362/346
[58] Field of Search ................... 362/11, 13, 227, 237, 362/346

[56] References Cited

U.S. PATENT DOCUMENTS 4,060,721  11/1977  Hanson et al. ........................ 362/13

*Primary Examiner*—Stephen J. Lechert, Jr.
*Attorney, Agent, or Firm*—Edward J. Coleman

[57] ABSTRACT

A compact photoflash unit comprising a plurality of flashlamps having lead-in wires connected to a circuit board containing thereon radiation-sensitive switching circuitry for sequentially flashing the lamps. Electrically conductive reflector panels are positioned between the lamps and the circuit board, and a sheet of electrically insulating material is interposed between the reflectors and the circuit board to prevent shorting of the circuitry on the circuit board by the conductive reflector. The insulating sheet, which may be of transparent plastic, is provided with T-shaped tabs which interlock with slots in the circuit board to secure the aligned position of the insulating sheet thereon. In assembling the photoflash unit, the insulating sheet is placed on the circuit board prior to mounting the lamps, and the T-shaped tabs of the sheet are inserted in the circuit board slots to secure the aligned location of holes in the insulating sheet with lamp-mounting eyelets in the circuit board.

9 Claims, 9 Drawing Figures ns Patent No. 4,152,751

PHOTOFLASH UNIT WITH SECURED INSULATOR

CROSS-REFERENCE TO RELATED APPLICATIONS

Ser. No. 840,497, filed Oct. 7, 1977, Emery G. Audesse et al., "Multilamp Photoflash Unit", assigned the same as this invention.

Ser. No. 840,498, filed Oct. 7, 1977, Donald E. Armstrong, "Multilamp Photoflash Unit", assigned the same as this invention.

Ser. No. 860,759, filed Dec. 15, 1977, Boyd G. Brower, "Multilamp Photoflash Unit With More Reliable Circuit Arrangement", assigned the same as this invention.

BACKGROUND OF THE INVENTION

The present invention relates to multilamp photoflash units and, more particularly, to improved means and methods for providing electrical insulation between adjacent elements in compact multilamp photoflash units.

Numerous multilamp arrangements with various types of sequencing circuits have been described in the prior art; particularly in the past few years. A currently marketed photoflash unit (described in U.S. Pat. Nos. 3,894,226; 3,912,442; 3,935,442; 3,937,946; 3,941,992; 3,952,320 and 4,017,728 and referred to as a flip flash) employs high-voltage type lamps adapted to be ignited sequentially by successively applied high voltage pulses from a source such as a camera-shutter actuated piezoelectric element. The flip flash unit comprises an elongated planar array of eight high-voltage type flashlamps each having a pair of lead-in wires connected to a printed circuit board by means of eyelets secured thereon. The circuit board is provided with switching circuitry for causing sequential flashing of the lamps, and an array of respectfully associated reflectors are positioned between the lamps and the circuit board. The reflectors for the lamps can be made as a single reflector member shaped to provide multiple individual reflectors for the lamps. The reflector member preferably is electrically conductive, such as being made of metal or metal-coated plastic, and is electrically connected to an electrical "ground" portion of the circuitry on the circuit board. Thus the reflector member functions as an electrical shield reducing the possibility of accidental flashing of lamps by an electrostatic voltage charge on a person or object touching the unit. Such accidental flashing is particularly prone to occur in this instance as the lamps are high voltage types requiring a firing voltage of 500 to 4000 volts, for example, at low current.

Although an electrically conductive reflector is desirable, as has just been explained, care must be taken to prevent the reflector unit from shorting the circuitry on the circuit board, which is located immediately behind the reflector unit, thus preventing the circuit from flashing the lamps. According to the above referenced U.S. Pat. No. 3,894,226, Hanson, this problem is solved by interposing between the reflector unit and circuit board a sheet of electrically insulating material to prevent shorting of the circuitry on the circuit board by the conductive reflector. The insulating sheet may be of a transparent plastic a few thousandths of an inch thick, which transmits sufficient radiation from flashing lamps to actuate adjacent radiation switches in the switching circuitry, and also to actuate flash indicators located behind the circuit board. Typical method steps for assembling such a unit are as follows. First, the printed circuit board is provided with terminals, conductive runs, and radiation sensitive switches. Next, eyelets for holding the lamp lead-in wires are inserted through selectively located holes in the circuit board. The lamps are then mounted on the circuit board by inserting the lead-in wires into the eyelets and bending and crimping the eyelets. The back of the reflector unit is provided with a pair of locating studs which correspond with locating holes in the insulating sheet and the circuit board. Hence, in the next step, the insulating sheet is assembled to the reflector member by aligning the reflector studs with the locating holes in the sheet. The reflector-insulating sheet assembly is then joined with the lamp-circuit board assembly by passing the lamps through large openings in the insulating sheet (denoted 53 in the Hanson patent) and corresponding aligned openings in the reflector (denoted as 52 in the Hanson patent). Once the reflector-insulating sheet assembly is securely mated with the circuit board, with the studs of the reflector placed into the locating holes of the circuit board, the lamps, which had been substantially normal to the surface of the circuit board, are now bent over into the reflector cavities such that the lamp axes are substantially coplanar and parallel to the circuit board. Thereafter, the remaining portions of the unit assembly are completed.

The above-referenced copending application Ser. No. 840,497, Audesse et al., describes an improved multilamp photoflash unit which more efficiently utilizes a given housing volume and thereby reduces the cost of the unit per flashlamp contained therein. More specifically, a compact lamp arrangement is provided whereby additional lamps are contained in a given volume while maintaining light output performance requirements. In a particular embodiment described, ten lamps are provided in a housing having the same dimensions as the above-discussed eight-lamp flip flash units. The greater compactness is provided by arranging the planar array of lamps in two parallel columns with the tubular envelopes horizontally disposed and with the lamps of one column staggered with respect to the other such that the bases are interdigitated. A pair of reflector panels are aligned with the two columns of lamps and arranged overlie the lamp lead-in wires and bases.

As may well be appreciated, the above-described compact ten-lamp array imposes a significant challenge with respect to packing design and the lay out of a suitable sequencing circuit on the associated printed circuit board. In particular, the electrically sensitive circuit pattern is so dense on the lamp mounting surface of the circuit board, that the luxury of large openings in the transparent insulating sheet for facilitating assembly over the lamps can no longer be tolerated. In order to adequately provide electrical insulation between the conductive reflector members and the dense pattern of circuitry on the circuit board, openings in the insulating sheet must be keep to an absolute minimum. Hence, the insulating sheet must be placed on the sensitive circuit board surface prior to lamp mounting, with small holes provided on the sheet for passing the lamp lead-in wires into the eyelets on the circuit board for bending and crimping. Another difference in the assembly is that the lamps are mounted for being disposed horizontally in the finished array, whereas in the prior art eight-lamp array the lamps were disposed vertically, and two reflector panels, comprising the two halves of the total reflector array, are joined together from each side onto the lamp-insulator-circuit board assembly. There is no lamp-fitting hole in each reflector panel since the lamps are positioned directly into the reflector cavities as the panel is positioned on the insulator-covered circuit board. In view of the necessary changes in configuration and assembly procedures for the aforementioned compact photoflash unit, a problem arises as to how to maintain the critical alignment of the insulating sheet on the printed circuit board during manufacturing assembly on high volume, automated production equipment.

SUMMARY OF THE INVENTION

Accordingly, it is an object of the present invention to provide an improved multilamp photoflash unit which more efficiently utilizes a given housing volume and provides a feasible and more economical way of preventing short circuiting of the lamp sequencing circuit by an adjacent conductive reflector.

A principal object of the invention is to provide means for maintaining the aligned position of an insulating sheet on a circuit board in a compact multilamp photoflash unit.

Another object is to provide an improved method for assembling a compact multilamp photoflash unit.

These and other objects, advantages and features are attained in a photoflash unit comprising a circuit board having lamp firing circuitry on the surface thereof, a plurality of flashlamps positioned over the surface and having lead-in wires connected to the circuitry, electrically conductive reflector means positioned between the lamps and the circuit board and a sheet of electrically insulating material interposed between the reflector means and the circuit board. In accordance with the invention, at least two spaced-apart tab means are provided in the sheet of insulating material, and at least two apertures are provided in the circuit board for receiving the tab means of the insulating sheet. During assembly, the tab means of the insulating sheet are respectively interlocked in the circuit board apertures for locating and securing the insulating sheet on the circuit board. In a preferred embodiment, the tab means are T-shaped, and the apertures comprise rectangular slots in the circuit board. Further, on the opposite side of the circuit board from that containing the lamp firing circuitry, there is provided a lateral recess adjacent to the slots for receiving the lateral portions of the T-shaped tab means. In this manner, the insulating sheet is locked in position on the circuit board to prevent displacement in any direction.

In a preferred method of assembly, a circuit board is provided having a lamp firing circuit on the surface thereof and a plurality of eyelet-receiving openings therethrough at selected locations. The circuit board also includes rectangular slots located at diametrically opposite corners thereof. A plurality of eyelets are placed through the circuit board openings, and a sheet of insulating material is placed over the surface of the circuit board. The insulating sheet has a plurality of openings respectively aligned with the eyelets in the circuit board and has T-shaped tab means cut therein at diametrically opposite corners thereof in alignment with the rectangular slots in the circuit board. The tab means are then inserted into the rectangular slots to secure the aligned position of the insulating sheet on the circuit board. Next a plurality of flashlamps with lead-in wires are positioned over the circuit board, and the lead-in wires of the lamps are respectively inserted through the openings of the insulating sheet into the circuit board eyelets. The eyelets are then bent to secure the eyelets and lead-in wires to the circuit board. Electrically conductive reflector means are then inserted between the lamps and the sheet of insulating material mounted on the circuit board, and the lamps are positioned into the reflectors. The remaining portions of unit assembly are then completed.

BRIEF DESCRIPTION OF THE DRAWINGS

This invention will be more fully described hereinafter in conjunction with the accompanying drawings, in which.

DESCRIPTION OF PREFERRED EMBODIMENT

Figure 1:
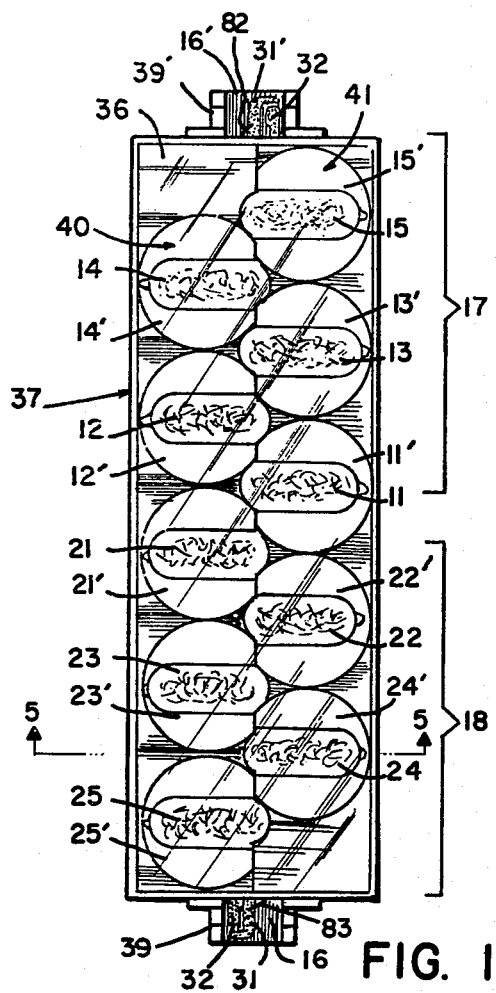
FIG. 1 is a front elevation of a multilamp photoflash unit in which the present invention is employed.

FIG. 1 illustrates a multilamp photoflash unit of the type described in the aforementioned copending application Ser. No. 840,497, Audesse et al. This unit is similar in general operation to that described in the aforementioned U.S. Pat. No. 4,017,728, except that the construction has been modified to include additional lamps in a housing having the same outer dimensions. Whereas the unit described in the above-mentioned patent included a planar array of eight high voltage type flashlamps (two groups of four) with associated reflector cavities provided in a single reflector member, the present unit comprises a planar array of ten photoflash lamps 11–15 and 21–25 mounted on a printed circuit board 43 (see FIGS. 2, 4 and 5) with an array of respectively associated reflector cavities 11'–15' and 21'–25' disposed therebetween. The lamps are horizontally disposed and mounted in two parallel columns, with the lamps of one column staggered relative to the lamps of the other column. Each of the lamps has a pair of lead-in wires 11a, 11b, etc., connected to the printed circuitry on board 43 by respective eyelets 11a' and 11b', etc. The column of the lamps 15, 13, 11, 22, and 24 are positioned with their respective bases interdigitated with the bases of the adjacent column comprising lamps 14, 12, 21, 23 and 25, the bases of one column thereby facing the adjacent column. The reflector cavities are provided on a pair of strip-like penels 40 and 41 which are conveniently separable for assembly purposes, as particularly illustrated in FIG. 4. The array is provided with a plug-in connector tab 16 at the lower end thereof which is adapted to fit into a camera or flash adapter. A second plug-in connector tab 16' is provided at the top end of the unit, whereby the array is adapted to be attached to the camera socket in either of two orientations, i.e., with either the tab 16 or the tab 16' plugged into the socket. The lamps are arranged in two groups of five disposed on the upper and lower halves, respectively, of the elongated, rectangular-shaped array. Upper group 17 comprises lamps 11–15, and lower group 18 includes lamps 21–25; the reflector cavities 11' etc. are disposed behind the respective lamps so that as each lamp is flashed, light is projected forwardly of the array. The lamps are arranged and connected so that when the array is connected to a camera by the connector tab 16, only the upper group 17 of lamps will be flashed, and when the array is turned end for end and connected to the camera by the other connector tab 16', only the then upper group of lamps will be flashed. By this arrangement, only lamps relatively far from the camera lens axis are flashable, thus reducing the undesirable red-eye affect.

The construction of the array comprises front and back housing members 36 and 37 (see FIGS. 1 and 5) which preferably are made from plastic and are provided with interlocking members (not shown) which can be molded integrally with the housing members and lock the housing members together in final assembly to form a unitary flash array structure. In the preferred embodiment, the front housing member 36 is a rectangular concavity and the back housing member 37 is substantially flat and includes integral extensions 39 and 39' at the ends thereof which partly surround and protect the connector tabs 16 and 16' and also function to facilitate mechanical attachment of the camera socket. Sandwiched between the front and back housing members 36 and 37, in the order named, are the flashlamps 11, etc., the pair of adjacent strip-like reflector panels 40 and 41 (preferably each being an aluminum-coated plastic molding) shaped to provide the individual reflector cavities 11', etc., a transparent electrically insulating sheet 42 (see, for example, FIGS. 3–5), the printed circuit board 43 provided with integral connector tabs 16 and 16', and indicia sheet 44 (denoted only in FIG. 5) which may be provided with information and trademarks, and other indicia such as flash indicators located behind the respective lamps and which change color due to heat and/or light radiation from a flashing lamp, thus, indicating at a glance which of the lamps have been flashed and not flashed.

Figure 4:
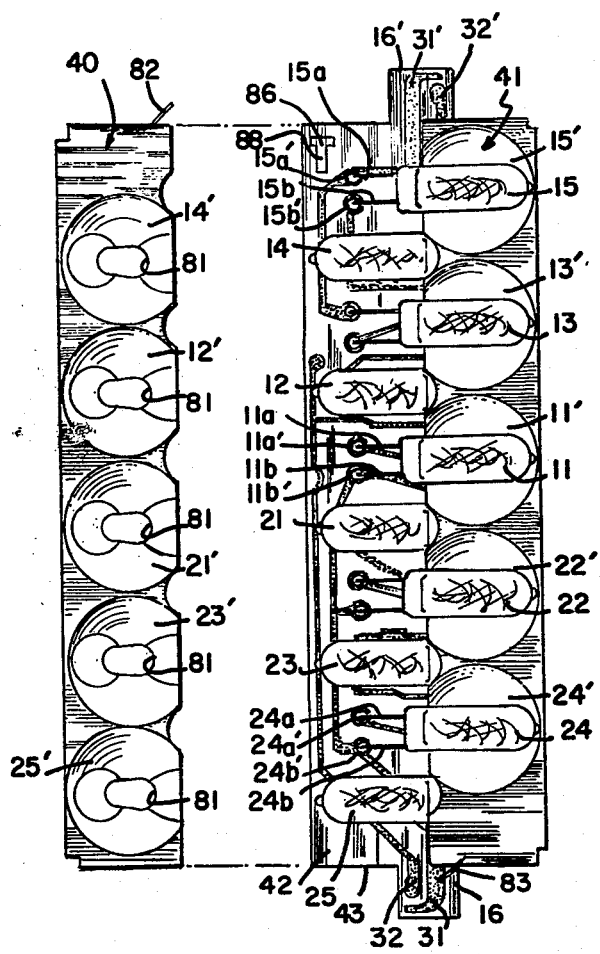
FIG. 4 is a front elevation of the unit of FIG. 1 with the cover removed and one of the reflector panels separated and spaced to the side.

Referring to FIG. 4, window means, such as openings 81, are provided in each of the reflector cavities 11', etc., behind the lamp aligned therewith. The circuit board 43 is provided with corresponding openings 30 to facilitate radiation from the flashlamps reaching the flash indicators. The rear member 37 is transparent (either of clear material or provided with window openings) to permit viewing of the indicia on the indicia sheet. The front housing member 36 is transparent, at least in front of the lamps 11, etc., to permit light from the flashing lamps to emerge forwardly of the array and may be tinted to alter the color of the light from the flashlamps. The height and width of the rectangular array are substantially greater than its thickness, and the height and width of the reflector panels 40, 41, the insulating sheet 42, and the circuit board 43 are substantially the same as the interior height and width of the housing member 36 to facilitate holding the parts in place.

The tab 16, which is integral to the circuit board 43, is provided with a pair of electrical terminals 31 and 32, and similarly the tab 16' is provided with a pair of terminals 31' and 32', for contacting terminals of a camera socket for applying voltage pulses to the array. The terminals 31 and 31' are shown as having a J-shaped configuration for temporarily shorting the socket terminals, while the array is being plugged in, to discharge any residual voltage charge in the firing pulse source and also to reduce the likelihood of lamps being accidently flashed by electrostatic voltage when the array is handled.

Figure 2:
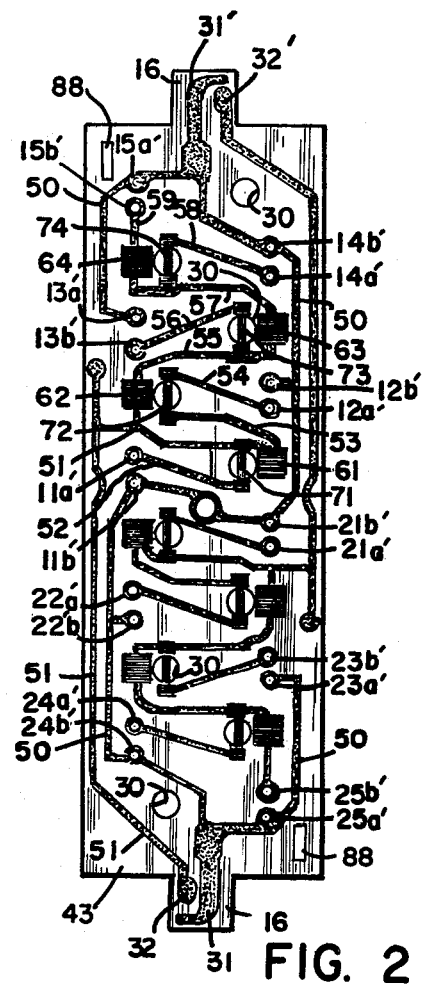
FIG. 2 is a front elevation of a printed circuit board used in the unit of FIG. 1, the circuit board including slots for receiving insulator sheet tabs in accordance with the invention.

Referring to FIG. 2, the circuit board 43 has a "printed circuit" thereon for causing sequential flashing of the lamps by firing voltage pulses applied to the terminals 31, 32, 31', 32'. The printed circuit may be functionally similar to that described in the aforementioned U.S. Pat. Nos. 3,894,226 or 4,017,728 except for extending the circuitry to accommodate an additional lamp in each half of the printed circuit board. A preferred embodiment of the circuitry, however, is that described in the previously referenced copending application Ser. No. 860,759, filed Dec. 15, 1979. The top and bottom halves of the printed circuitry preferably are reverse mirror images of each other. The lead wires 11a, 11b, etc., underlie the reflector panels and pass into or through suitable openings 11a'', 11b'', etc., in the insulating sheet 42 (FIG. 3) and into or through the respective pairs of eyelets 11a', 11b', etc. in the circuit board. The shanks of the eyelets which project from the other side of the board are then crimped or bent (FIG. 5) to hold the lead wires and make electrical contact thereto and also to hold the eyelets in place with there heads in electrical contact with the circuit of the circuit board. As previously mentioned, the reflector panels 40 and 41 are preferably made of metal-coated plastic so that they are electrically conductive. Each reflector panel is electrically connected to a "ground" or common connection circuit by means such as wires 82 and 83. More specifically, referring to FIGS. 1 and 4, wire 82 connects the conductive reflector panel 40 to the terminal 31', and wire 83 connects the conductive reflector panel 41 to terminal 31. Terminals 31 and 31' are part of an electrical "ground" circuit run 50 on the board 43 which makes contact with one of the connector eyelets 11a', 11b', etc., for each of the lamps 11, etc., whereby the reflector panels 40 and 41 additionally function as an electrically grounded shield, as generally described in the aforementioned flip flash patents.

As further described in U.S. Pat. Nos. 3,894,226 and 4,017,728, the circuitry on circuit board 43 includes radiation switches which are in contact with and bridge across circuit runs that are connected to them. A preferred circuit arrangement is that described in the aforementioned copending application Ser. No. 860,759, filed Dec. 15, 1979. It will be noted that the circuit located in the upper half of the circuit board of FIG. 2 and activated by the pair of input terminals 31 and 32 includes five flamps 11–15 arranged in parallel across the input terminals and four normally closed radiant-energy-activated disconnet switches 71, 72, 73 and 74 each connected in series with a respective one of the lamps 11–14. Each disconnect switch is responsive to the flashing of a lamp with which it is series connected to form an open circuit. The circuit also includes four normally open radiant-energy-activated connect switches 61, 62, 63, and 64 for providing sequential flashing of the lamps 11–15 in response to firing pulses successively applied to the input terminals 31 and 32. The material for the connect switches 61–64 is selected to be of the type initially having an open circuit or high resistance, the resistance thereof becoming nearly zero or a lower value when the material receives radiation in the form of heat and/or light from a respective adjacent lamp, upon the lamp being flashed. For this purpose, each of the connect switches is respectively positioned behind and near to an associated flashlamp. To facilitate radiation transfer from the flashlamp to its corresponding connect switch, each of the reflectors includes a window means, such as an opening 81 (FIG. 4), in alignment with the respective radiation connect switches. In addition, the sheet of insulating material 42, which is disposed between the reflector panels and the printed circuitry, is of a material which is transparent to the lamp radiation. Each of the connect switches has a composition which may comprise a known mixture of silver compound and a binder. According to a preferred embodiment, the material comprises a silver compound such as silver carbonate, a binder such as polystyrene resin, and a protective oxidizing agent, such as barium chromate, as described in a copending application Ser. No. 733,599, John W. Shaffer, filed Oct. 18, 1976, and assigned to the present assignee. For example, the dry composition of a specific silk screenable high resistance material such as has been employed for such a patch pattern (i.e. switches 61–64) comprises 98.75 percent silver carbonate, 0.25 percent barium chromate, and 1.0 percent polystyrene resin as a binder.

As described in the previously referenced U.S. Pat. No. 4,017,728, Audesse et al., each of the disconnect switches 71–74 comprises a length of electrically conductive, heat-shrinkable, polymeric material which is attached to the circuit board at both ends, with its mid-portion spatially suspended to avoid contact with the heat absorbing surface of the circuit board. This arrangement maximizes the speed with which the shrinking and separation of the mid-portion of the switch element occurs upon its being heated by the radiant output of an ignited flashlamp. More specifically, the disconnect switch comprises a thin strip of plastic preferably fabricated from mono- or biaxially oriented polyethylene, polypropylene, polystyrene, polyester or nylon. The polymeric material itself may be rendered electrically conductive by esters such as carbon, or it may be rendered surface conductive by deposition of conductive layers thereon. The performance of highly reflective materials, such as aluminized polypropylene, can be enhanced by applying a coating of light-absorbing ink or other similar material on the surface facing the flashlamp. The piece of switch material may be self-adhesive, such as a tape, and pressure applied to attach both ends of the strip (71–74) to the circuit board as illustrated. Each attached strip is located so that it bridges a respective one of the circuit board apertures 30 so as to provide the desired spatial suspension of the mid-portion of the strip. For silk screened circuitry, it is advantageous to carry the circuit pattern over the ends of the preapplied switch strip. In this manner, the circuit material helps to anchor the switch ends to the circuit board substrate, in addition to providing electrical connection at both ends of the switch material to the printed circuit.

By locating the disconnect switch strips 71–74 across the apertures 30, each element of heat shrinkable material is positioned so as to be in operative relationship with the radiant output of its respective lamp via an aperture 81 in the back of the reflector. To further enhance radiation transfer, the interposed sheet of insulating material 42 contains very small openings 84 (FIG. 3), each of which is in alignment with the mid-portion of a respective one of the disconnect switch strips 71–74 when the sheet 42 is assembled with the circuit board 43. Hence, upon ignition of a given flashlamp, the switch material is radiantly heated so that it weakens and softens as well as shrinks. As separation occurs near the center of each piece, the two separate ends shrink back away from each other so as to give an open circuit that will reliably withstand several thousand volts without leakage. Since a lamp after flashing is removed electrically from the circuit, the subsequent lamps are unaffected by short circuiting or residual conductivity in previously flashed lamps.

Terminal 32 is part of a conductor run 51 that terminates at three different switches, namely, the disconnect switch 71, the connect switch 61, and the connect switch 62. The other side of switch 71 is connected to lamp 11 via circuit run 52 and eyelet 11a'. Circuit run 53 connects switches 61 and 72, and circuit run 54 connects the other side of switch 72 to lamp 12 eyelet 12a'. A circuit run 55 interconnects switches 62, 73 and 63, while the other side of switch 73 is connected to lamp 13 via circuit run 56 and eyelet 13b'. Switches 63, 74 and 64 are interconnected by a circuit run 57, while the other side of switch 74 is connected to lamp 14 via circuit run 59 and eyelet 14a'. Finally, a circuit run 59 connects the other side of switch 64 to lamp 15 via eyelet 15b'.

The circuit on the circuit board 43 functions as follows. Assuming that none of the five lamps in the upper half of the unit have been flashed, upon occurrence of the first firing pulse applied across the terminals 31 and 32, this pulse will be directly applied to the lead-in wires of the first connected flashlamp 11, whereupon the lamp 11 flashes and becomes an open circuit between its lead-in wires. Heat and/or light radiation from the flashing first lamp 11 is operative via its respective reflector aperture to activate the disconnect switch 71 and the connect switch 61. As a result, the normally closed disconnect switch 71 is operative in response to the radiation from the lamp to rapidly provide a reliable open circuit to high voltage and thus electrically remove lamp 11 from the circuit, whereby the subsequent lamps 12–15 are unaffected by short circuiting or residual conductivity in lamp 11. The radiation causes the normally open connect switch 61 to become a closed circuit (or a low value or resistance), thereby connecting the circuit board terminal 32 electrically to the second lamp 12 via the normally closed disconnect switch 72. By the time this occurs, the firing pulse has diminished to a value insufficient to cause the second lamp 12 to flash. When the next firing pulse occurs, it is applied to the lead-in wires of the second lamp 12 via the now closed connect switch 61 and disconnect switch 72, whereupon the second lamp 12 flashes, thereby causing disconnect switch 72 to rapidly provide an open circuit and causing the next switch 62 to assume near zero or low resistance. Once switch 62 has been activated, the resistance of the connect switch 61 is bypassed along with any potential discontinuity caused by the disconnect switch 71. When the next firing pulse occurs, it is applied via now closed connected switch 62 and disconnect switch 73 to the third lamp 13, thereby firing that lamp, whereupon the radiation from lamp 13 activates disconnect switch 73 to rapidly provide an open circuit and causes connect switch 63 to become essentially a closed circuit across its terminals. The next firing pulse will be applied via now closed connect switch 63 and disconnect switch 74 to the lead-in wires of the fourth flashlamp 14, thereupon causing the lamp to flash. The radiation from 14 activates the disconnect switch 74 to rapidly provide an open circuit and causes connect switch 64 to become essentially a closed circuit across its terminals. Thus, the next firing pulse will be applied via now closed connect switch 64 to the lead-in wires of the fifth flashlamp 15, thereupon causing the lamp to flash. Since this lamp is the last lamp in the active circuit, it does not matter whether its lead-in wires are an open or closed circuit after flashing. The flash indicator aligned behind the last lamp 15 may be of a special type, such as that described in copending application Ser. No. 844,872, filed Oct. 25, 1977 and assigned to the present assignee, for particularly alerting the user to remove the flash unit from the camera and either turn it around or obtain a fresh unit. In such an application, it is desirable to provide larger openings 85 (FIG. 3) in the insulator sheet 42 which coincide with the circuit board openings 30 disposed behind the last lamps 15 and 25. Such an opening assures sufficient radiation transfer from the flashed lamp to properly activate the last-flash indicator. When the flash unit is turned around and the other connector tab 16' attached to the camera socket, the group 18 of lamps that then becomes upper most and farthest away from the lens axis will be in the active circuit and will be flashed in the same manner as has been described. In a preferred embodiment, the lamps 11, etc., are high voltage type requiring about 2000 volts, for example, at low current for flashing, and they can be fired by impacting or stressing a piezoelectric element in the camera.

Of particular concern with respect to the present invention is the electrically insulative sheet 42 which is provided between the reflector panels 40 and 41 and the circuit board 43. As pointed out hereinbefore, since the reflector panels 40 and 41 are electrically conductive and connected to electrical ground of the circuit so as to function as a shield, any conductive areas on the back surface of the reflector unit could, but for the sheet 42, touch circuit runs or switches 61-64 and 71-74 on the circuit board and cause a short circuit which would prevent the sequencing circuitry from functioning. The sheet 42 may be thin, such as a few thousandths of an inch thick, and made of plastic, such as cellulose acetate or polyethylene terephthalate resin (the later material being available as Mylar polyester film, Mylar being a registered trademark of E. I. du Pont de Nemours and Co.) which transmits a sufficient amount of radiation (heat and/or light) from flashing lamps to actuate the switches 61-64 and 71-74 and flash indicators (not shown). Of course, in this instance, openings 84 and 85 are provided through sheet 42 in alignment with the openings 81 in the reflector panels to improve radiation transfer. Use of the insulator sheet 42 permits the reflector panels to be very close to the circuit board 43, resulting in a compact array construction, and prevents shorting of the circuit by the reflector unit.

Figure 3:
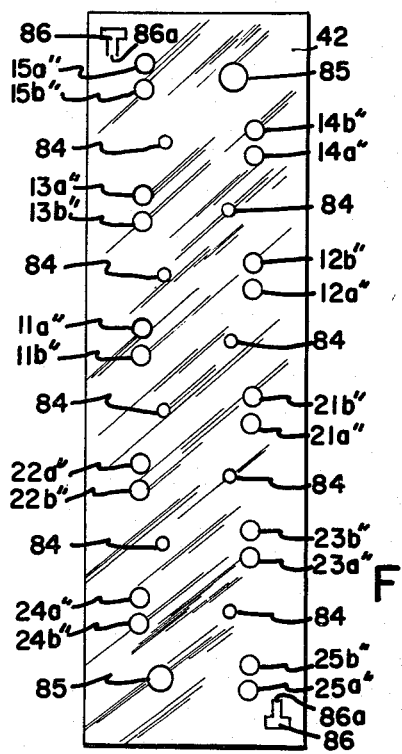
FIG. 3 is a front elevation of a sheet of electrically insulating material having tabs and openings in accordance with the invention.

In accordance with the invention, as distinguished from the previously discussed insulator sheet for an eight lamp flip flash unit as described in U.S. Pat. No. 3,894,226, the sheet of insulating material 42 employed in the ten-lamp array of FIG. 1 is provided, as illustrated in FIG. 3, with a plurality of very small holes 11a", 11b", etc., through which the lead-in wires of the flashlamps are connected to the circuitry on the circuit board by means of the eyelets 11a', 11b', etc. As previously discussed, the openings in sheet 42 must be of a very small size so as to maximize the insulating area of sheet 42 in view of the extreme circuit pattern density on the circuit board 43 of FIG. 2. Accordingly, the holes 11a", 11b", etc., must be retained in proper alignment with respect to eyelets 11a', 11b', etc., and the corresponding lamp lead-in wires 11a, 11b, etc. during assembly of the unit in the manufacturing process. Further, in the case of the hole pattern illustrated in FIG. 3, the openings 84 must be retained in alignment with the midportions of the switch strips 71-74, and the openings 85 should be aligned with the circuit board openings 30 aligned behind the lamps at either end of the array. In accordance with the invention, the aforementioned objects of locating and securing the insulating sheet 42 on circuit board 43 are accomplished in a convenient and economical manner by providing at least two spaced-apart tab means 86 in the sheet of insulating material 42 and at least two apertures 88 in the circuit board 43 for receiving the tab means 86. During assembly, the tab means are interlocked in the circuit board apertures to thereby align the insulating sheet openings and securely retain the position of sheet 42 with respect to the circuit board.

In the preferred embodiment illustrated, each tab 86 is T-shaped and cut directly into the thin plastic insulating material 42. As particularly shown in FIG. 3, the T-shaped tabs 86 are located at diagonally opposite corners of the elongated, rectangular sheet 42. As will be made clear hereinafter, the planar insulating sheet 42 should be of a material which is sufficiently resilient such that, upon forced displacement of the tab 86 from the plane of the sheet and subsequent release, the tab will tend to spring back into the plane of the sheet. The aforementioned cellulose acetate and Mylar material of a few thousandths of an inch in thickness are quire suitable for this purpose. In deflecting the tabs 86 for insertion into the circuit board apertures 88, the base of the "T" which is connected to the remainder of sheet 42 functions as a hinge 86a.

Figure 6:
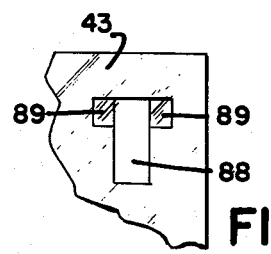
FIG. 6 is an enlarged fragmentary detail view of a portion of the opposite side of the circuit board of FIG. 2 showing lateral recesses adjacent to a slot therein in accordance with the invention.

As illustrated in FIG. 2, the apertures 88 in a preferred embodiment of the circuit board take the shape of rectangular slots located at diagonally opposite corners of the elongated, rectangular board 43. The surface of the circuit board on the opposite side of that containing the lamp firing circuitry, as illustrated in FIG. 6, is provided with lateral recesses 89 adjacent to the rectangular slots for receiving the lateral portions 86b (denoted in FIG. 7) of the T-shaped tab in sheet 42.

Figure 7:
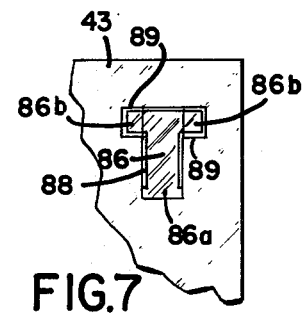
FIG. 7 is a detail view similar to that of FIG. 6 but showing a T-shaped tab of the insulator sheet locked in position in accordance with the invention.
Figures 5, 8:
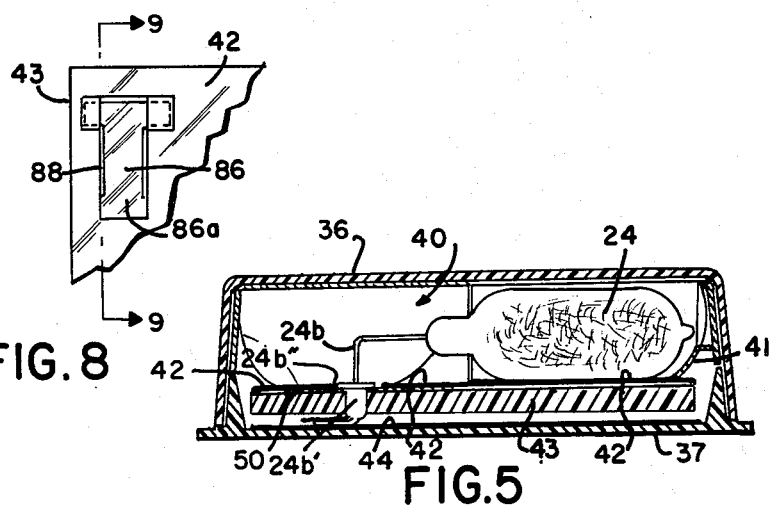
FIG. 5 is an enlarged cross-sectional view taken along 5—5 of FIG. 1.
FIG. 8 is an enlarged fragmentary detail view of a portion of the circuit board and insulator sheet assembly exposed in FIG. 4 showing the tab of the insulator sheet inserted in the circuit board slot and locked in position in accordance with the invention (i.e., FIG. 8 relates to the assembly portion of FIG. 7 as seen from the opposite side)
Figure 9:
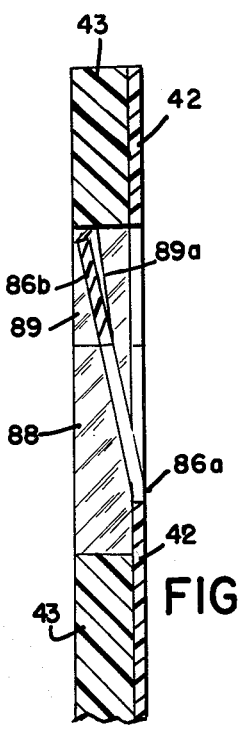
FIG. 9 is an enlarged cross-sectional view taken along line 9—9 of FIG. 8.

Referring to FIGS. 7, 8, and 9, which show various views of the interlocked position of tab 86 in slot 88, the locating and securing of sheet 42 to the circuit board is accomplished by aligning each of the T-shaped tabs 86 with the corresponding slots 88 in the circuit board, the sheet 42 being positioned on the side of the circuit board facing the viewer in FIG. 2. Means, such as a rectangular plunger, is then used to insert the tab 86 into the respective slot 88 whereupon the lateral portions 86b of the resilient tab material are bent back as they pass through the rectangular slot. Once portions 86b clear the opposite side of the slot, the plunger is retracted, and the resilient tab 86 springs back toward the plane of sheet 42 and, in so doing, causes the lateral portions 86b of the tab to nest into the lateral recesses 89 on each side of the circuit board slot 88 thereby locking the insulating sheet 42 into position on the circuit board to prevent displacement in any direction. It will be noted that the lateral recesses 89 are located toward the end of the slot 88 facing the outer end of the circuit board, as shown in FIG. 9, the inner surface 89a of the recess may be inclined somewhat with respect to the planar surfaces of the circuit board. More specifically, the slope of the surface 89a is such that the thickness dimension of the board becomes reduced toward the end of the recess 89 adjacent the shank portion of the T-shaped tab 86. That is, referring to FIG. 9, the recess surface 89a slopes toward the side of the board 43 on which sheet 42 is mounted. In this manner, the lateral tab portions 86b are caused to engage the corners of the recess at an angle to the plane of the board, as illustrated in FIG. 9. This assures that the tab will bind itself in the locked position as sheet 42 is pulled from above, whereas, if the lateral portions 86b were positioned flat against a parallel recess surface, the tab, under stress, could be disengaged by bending of the lateral portions 86b in the same manner as when it was inserted.

A preferred method for assembling a photoflash unit in accordance with the invention comprises the following steps. First, a printed circuit board 43 is provided which has a plurality of eyelet receiving openings therethrough at selected locations, the openings 30, the rectangular slots 88 located at diagonally opposite corners thereof, and lamp firing circuitry on one surface, such as the terminals 31, 32, 31' and 32', the conductor runs 50–59, the connect switch patches 61–64, and the disconnect switch strips 71–74. The circuit board 43 can comprise a molded piece of a relatively thin plastic material such as polystyrene, and the conductor runs and connect switch patches may be applied by successive silk screening techniques, the disconnect switch strips having been machine applied and adhesively attached to the board, as previously discussed.

After providing a circuit board as described above, a plurality of eyelets 11a', 11b', etc., are placed through the openings in the circuit board provided therefore. Next, the sheet of insulating material 42 is placed over the surface of the circuit board upon which the lamp firing circuitry is located, sheet 42 having a plurality of openings 11a', 11b', etc., respectively aligned with the eyelets 11a', 11b', etc., and having T-shaped tab means 86 cut therein at diagonally opposite corners of the sheet in alignment with the rectangular slots 88 in the circuit board. The T-shaped tabs 86 are then inserted into the rectangular slots 88, by means such as a rectangular shaped plunger, to secure the aligned location of the sheet on the circuit board. Next, a plurality of flashlamps 11–15 and 21–25 are positioned over the insulator covered surface of the printed circuit board, and the respective lead-in wires 11a, 11b, etc., of the lamps are inserted respectively through the openings 11a", 11b", etc., of sheet 42 into respective eyelets 11a', 11b', etc. The eyelets are crimped and bent to secure the eyelets and lead-in wires to the circuit board, for example, as illustrated for the case of eyelet 24b' in FIG. 5. Next, the electrically conductive reflector panels 40 and 41 are inserted between the lamps and sheet of insulating material mounted on the circuit board, and the lamps are positioned in the reflectors as illustrated in FIGS. 1, 4 and 5. The assembly of the unit is thereafter completed by placing the indicia sheet insert on the rear housing member 37, placing the circuit board-insulator-lamp-reflector assembly over the indicia sheet on housing member 37, and the joining the front housing member 36 to the rear housing member 37 and sealing the assembly about the periphery thereof, such as by a sonic sealing method.

Although the present invention has been described with respect to specific embodiments, it will be appreciated that modifications and changes may be made by those skilled in the art without departing from the true spirit and scope of the invention.

What we claim is:

1. A photoflash unit comprising a circuit board having lamp-firing circuitry on a surface thereof, a plurality of flashlamps positioned over said surface and having lead-in wires connected to said circuitry, electrically conductive reflector means positioned between said lamps and said circuit board, and a sheet of electrically insulating material interposed between said reflector means and said circuit board, wherein the improvement comprises at least two spaced-apart tab means provided in said sheet of insulating material, and at least two apertures provided in said circuit board for receiving said tab means, said tab means respectively being interlocked in said apertures for locating and securing said sheet of insulating material on said circuit board.

2. The photoflash unit of claim 1 wherein said sheet of insulating material is further provided with a plurality of small holes through which the lead-in wires of said flashlamps are connected to the circuitry on said circuit board, said holes being retained in proper alignment with respect to said lead-in wires by means of said interlocked tab means.

3. The photoflash unit of claim 2 wherein each of said tab means is T-shaped, and the surface of said circuit board on the opposite side of that containing lamp firing circuitry is provided with lateral recesses adjacent to said apertures for receiving the lateral portions of said T-shaped tab means, whereby said sheet of insulating material is locked in position on said circuit board to prevent displacement in any direction.

4. The photoflash unit of claim 1 wherein said tab means are initially cut in the plane of said sheet, and said insulating material is sufficiently resilient that, upon forced displacement of said tab means from the plane of said sheet and subsequent release, said tab means will tend to spring back into the plane of said sheet.

5. The photoflash unit of claim 4 wherein said insulating sheet is a transparent plastic material comprising cellulose acetate or polyethylene terephthalate resin.

6. The photoflash unit of claim 4 wherein each of said tab means is T-shaped.

7. The photoflash unit of claim 6 wherein each of said apertures comprises a rectangular slot in said printed circuit board, and the surface of said circuit board on the opposite side of that containing lamp firing circuitry is provided with lateral recesses adjacent said rectangular slots for receiving the lateral portions of said T-shaped tab means, whereby said sheet of insulating material is locked in position on said circuit board to prevent displacement in any direction.

8. The photoflash unit of claim 7 wherein said circuit board has an elongated rectangular shape with a pair of connecting tabs projecting at opposite ends thereof, and said rectangular slots are located at diagonally opposite corners of said circuit board.

9. The photoflash unit of claim 6 wherein the bottom surface of each of said lateral recesses slopes toward the surface of said circuit board containing lamp firing circuitry, with the thickness dimension of said board being thinnest at the end of the recess adjacent the shank portion of the T-shaped tab means interlocked in the associated slot, said slope causing an edge of each lateral portion of the T-shaped tab means to engage the inner corner of the associated recess adjacent the shank portion of said tab means so as to bind said interlocked tab means against disengagement from said slot.

* * * * *